(12) United States Patent
Buettgen

(10) Patent No.: US 8,115,158 B2
(45) Date of Patent: *Feb. 14, 2012

(54) DEVICE AND METHOD FOR THE DEMODULATION OF MODULATED ELECTROMAGNETIC WAVE FIELDS

(75) Inventor: Bernhard Buettgen, Adliswill (CH)

(73) Assignee: MESA Imaging AG, Zurich (CH)

(*) Notice: Subject to any disclaimer, the term of this patent is extended or adjusted under 35 U.S.C. 154(b) by 0 days.

This patent is subject to a terminal disclaimer.

(21) Appl. No.: 12/984,931

(22) Filed: Jan. 5, 2011

(65) Prior Publication Data

US 2011/0101206 A1  May 5, 2011

Related U.S. Application Data

(63) Continuation of application No. 12/090,404, filed as application No. PCT/CH2006/000547 on Oct. 6, 2006, now Pat. No. 7,884,310.

(30) Foreign Application Priority Data

Oct. 19, 2005 (EP) ..................................... 05405590

(51) Int. Cl.
  *H01L 27/00* (2006.01)
(52) U.S. Cl. ................................. 250/208.1; 250/214 R
(58) Field of Classification Search ............... 250/208.1, 250/214 R, 239; 257/429, 186–229, 461–465; 438/99, 207, 241–249, 314, 739
See application file for complete search history.

(56) References Cited

U.S. PATENT DOCUMENTS 5,130,774 A * 7/1992 Stevens et al. ................ 257/445

FOREIGN PATENT DOCUMENTS

| DE | 4440613 C1 | 7/1996 |
| DE | 19821974 A1 | 11/1999 |
| EP | 1583150 A1 | 10/2005 |
| EP | 1624490 A1 | 2/2006 |
| GB | 2389960 A1 | 12/2003 |

OTHER PUBLICATIONS

European Search Report from Application No. EP 05 40 5590, filed Oct. 19, 2005, dated Apr. 24, 2006.

(Continued)

*Primary Examiner* — Que T Le
(74) *Attorney, Agent, or Firm* — Houston Eliseeva, LLP

(57) ABSTRACT

A new pixel in semiconductor technology comprises a photosensitive detection region (1) for converting an electromagnetic wave field into an electric signal of flowing charges, a separated demodulation region (2) with at least two output nodes (D10, D20) and means (IG10, DG10, IG20, DG20) for sampling the charge-current signal at least two different time intervals within a modulation period. A contact node (K2) links the detection region (1) to the demodulation region (2). A drift field accomplishes the transfer of the electric signal of flowing charges from the detection region to the contact node. The electric signal of flowing charges is then transferred from the contact node (K2) during each of the two time intervals to the two output nodes allocated to the respective time interval. The separation of the demodulation and the detection regions provides a pixel capable of demodulating electromagnetic wave field at high speed and with high sensitivity.

10 Claims, 10 Drawing Sheets

OTHER PUBLICATIONS

International Search Report from International Application No. PCT/CH2006/000547, filed Oct. 6, 2006, mailed on Dec. 18, 2006.

Buettgen, B. et al., "Demonstration of a Novel Drift Field Pixel Structure for the Demodulation of Modulated Light Waves with Application in Three-Dimensional Image Capture," SPIE, vol. 5302, Apr. 2004, pp. 9-20.

Hoffmann, "Surface Charge Transport with an MOS-Transmission-Line", Solid-State Electronics, vol. 20, pp. 177-181, 1977.

Jacoboni, "A Review of Some Charge Transport Properties of Silicon", Solid-State Electronics, vol. 20, pp. 77-89, 1977.

Lange, R. et al., "Demodulation Pixels in CCD and CMOS Technologies for Time-of-Flight Ranging," SPIE, vol. 3965, Jan. 24, 2000, pp. 177-188.

Lange, R. et al., "Solid-State Time-of-Flight Range Camera," IEEE Journal of Quantum Electronics, vol. 37, No. 3, Mar. 2001, pp. 390-397.

Lattes, A. L., "Ultrafast Shallow-Buried-Channel CCD's with Built-in Drift Fields," IEEE Electron Device Letters, vol. 12, No. 3, Mar. 1991, pp. 104-106.

Schwarte R. et al., "New optical four-quadrant phase detector integrated into a photogate array for small and precise 3D-cameras," SPIE vol. 3023, Feb. 11, 1997, pp. 119-128.

International Report on Patentability dated Jul. 8, 2008, from PCT/CH2006/000547 filed Oct. 6, 2006.

* cited by examiner

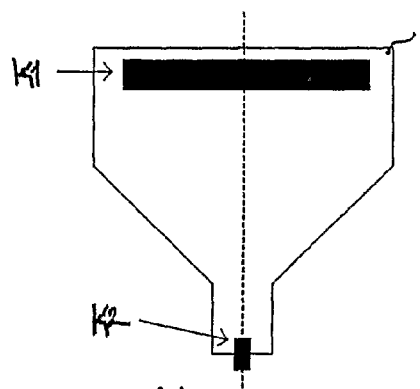
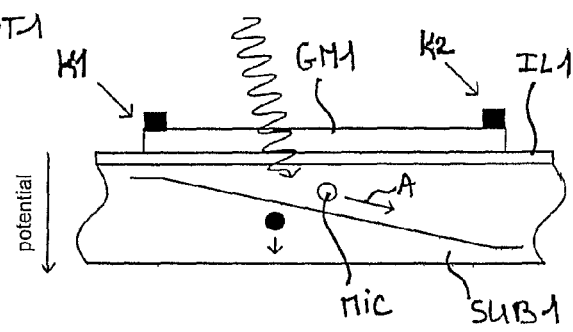
Fig. 6(a)        Fig. 6(b)
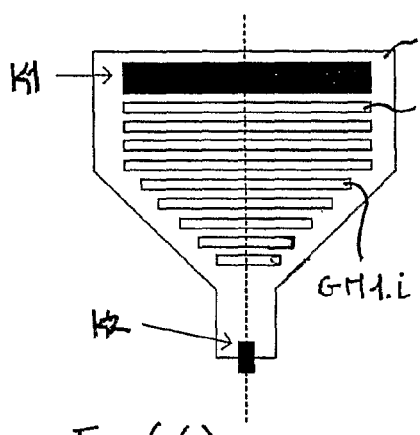
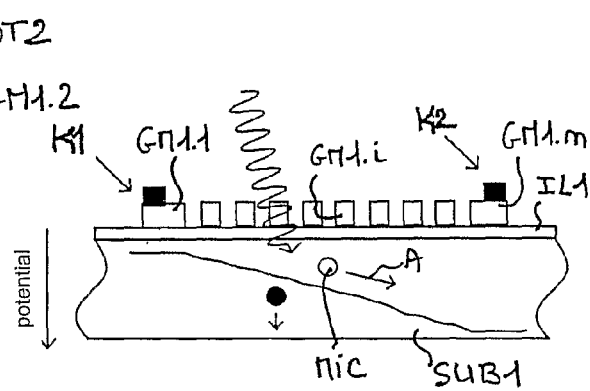
Fig. 6(c)        Fig. 6(d)
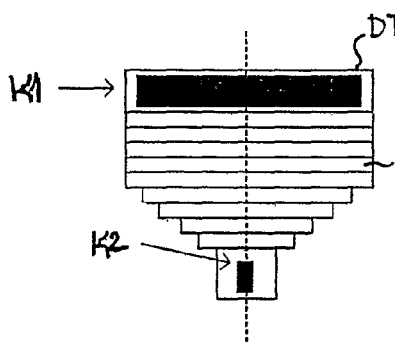
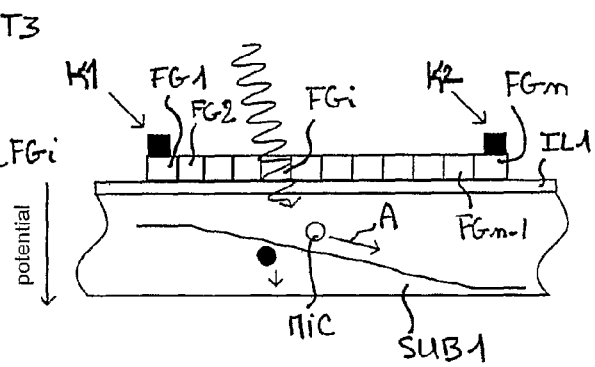
Fig. 6(e)        Fig. 6(f)

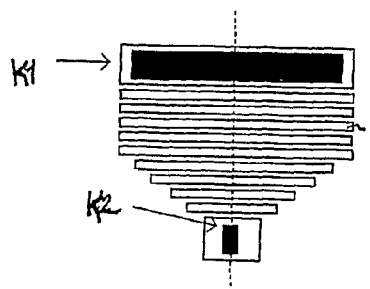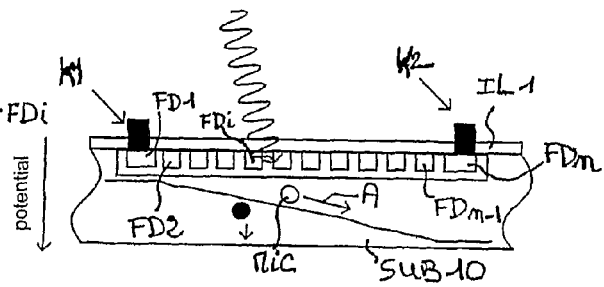
Fig. 6(g)  Fig. 6(h)
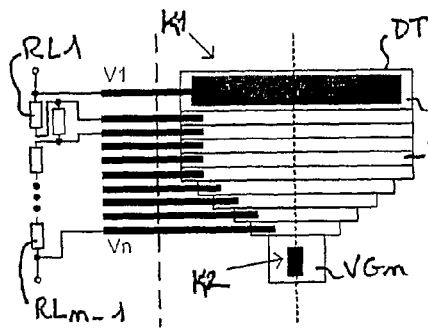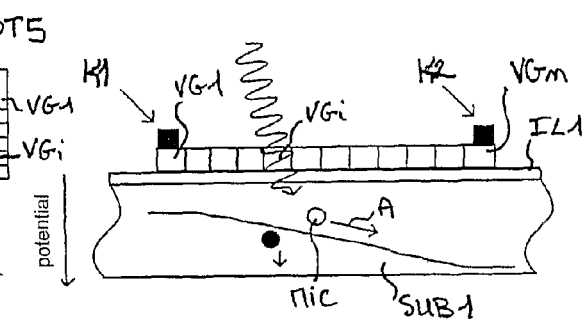
Fig. 6(i)  Fig. 6(j)
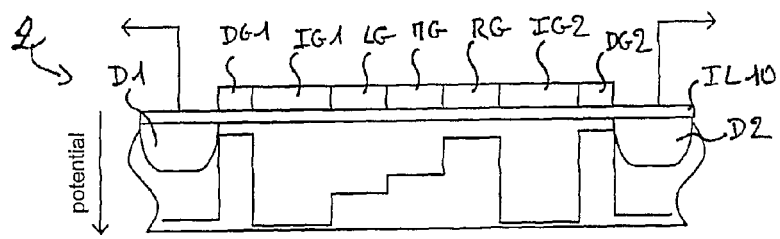
Fig. 7(a)
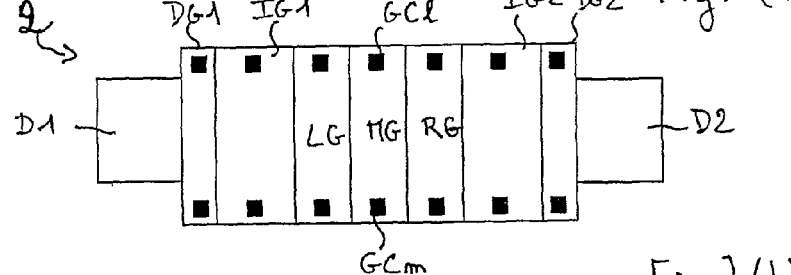
Fig. 7(b)

DEVICE AND METHOD FOR THE DEMODULATION OF MODULATED ELECTROMAGNETIC WAVE FIELDS

RELATED APPLICATIONS

This application is a Continuation of U.S. application Ser. No. 12/090,404, filed on Apr. 16, 2008, which is a 371 of International Application No. PCT/CH2006/000547, filed on Oct. 6, 2006, which claims priority to European Patent Application No. 05405590.0, filed on Oct. 19, 2005, all of which are incorporated herein by reference in their entirety.

FIELD OF THE INVENTION

The present invention relates to a pixel device for the detection and the demodulation of modulated electromagnetic waves, in particular waves of frequencies within the optical frequency spectrum, according to the preambles of the independent claims.

The pixel device can be exploited in all applications demanding high photo-sensitive pixel coupled with fast samplings on-pixel. These pixel characteristics are especially sought for demodulating temporally intensity-modulated electro-magnetic light waves. Such pixels are particularly interesting for non-contact distance measuring sensors based on the time-of-flight principle or interferometry but as well as in phase-measuring bio (chemical) applications such as fluorescence applications.

BACKGROUND OF THE INVENTION

In the German patent DE4440613C1 (Spirig, "Vorrichtung und Verfahren zur Detektion eines intensitätsmodulierten Strahlungsfeldes", 1996), a demodulation device is presented which samples the impinging optical sinusoidally-modulated light signal n times. Charge coupled devices are used for the detection of the light signal and the subsequent transport of the photo-generated charges. Speed limitations are mainly given by the slow diffusion processes during the charge-carrier transport. That problem becomes even more important when the pixel is designed with a large photo-detection region for increased sensitivity.

The German patent application DE19821974A1 (Schwarte, "Vorrichtung und Verfahren zur Erfassung von Phase und Amplitude elektromagnetischer Wellen", 1999) discloses a photon-mixing element. In order to get a pixel with high-sensitivity and high-speed demodulation facility, a combined structure of stripe-like elements, each of them with short transport paths, is proposed. Nevertheless, the stripe-like structure still leads to a bad fill-factor because the regions between the stripes are not photo-sensitive.

Another approach for large-area demodulation pixel with high sensitivity and high demodulation speed is given in the English patent application GB2389960A (Seitz, "Four-tap demodulation pixel", 2003). A high-resistive photo-gate of rectangular shape and large size generates a drift-field within the semiconductor substrate enforcing the photo-generated charges to drift to the particular sampling node. Here, any delay of the sampling signal arising on the photo-gate due to large RC-times could reduce the performance of such demodulation pixels. In particular, high frequencies are difficult to realize when many pixels are controlled at the same time. Then the external electronics and their limited driving capability of large capacities represent the constraining factor.

All pixel structures mentioned above have in common that the lateral conduction of the photo-generated charges into a specific direction is always related to the push-pull signal on a gate structure. In order to get higher sensitivities, the photo-detection region has to be enlarged. The results are either increased parasitic capacitances that have to be switched or longer transport paths. Both aspects are undesirable because they restrict the devices to be used with high-frequencies. If the switching gate capacities increase, the speed limitations are given by the driving electronic components. On the other hand, long transport paths reduce the speed of the photo-generated charges in the device making high demodulation frequencies impossible.

The new demodulation device overcomes the problem of making a trade-off between the sensitivity and the demodulation speed. Both aspects can be fulfilled by the pixel at the same time without putting up with any quality loss of the sampling signal or the fill factor. In contrast, the pixel brings up even more advantages that are explained below.

SUMMARY OF THE INVENTION

The object of the present invention is to provide a pixel structure available that shows both high-sensitivity and high speed capability in terms of demodulating the impinging signal, and other objects, e.g. the ability to operate at low power consumption. are solved by the device as defined in the first claim. Preferred, advantageous or alternative features of the invention are set out in dependent claims.

The pixel device of the invention in a semiconductor substrate is adapted to detect and/or demodulate an incident modulated electromagnetic wave field. It comprises detection means for converting the incident electromagnetic wave field into an electric signal of flowing charges sampling means for sampling the electric signal of flowing charges at least two different time intervals within a modulation period, and at least two output nodes for electric signals sampled by the sampling means.

The pixel device further comprises advantageously demodulation means comprising the at least two output nodes and the sampling means, the sampling means having second transfer means, a contact node arranged between the detection means and the demodulation means, and the detection means comprising first transfer means. The first transfer means are adapted to transfer the signal of flowing charges to the contact node, the second transfer means are adapted to transfer the signal of flowing charges from the contact node during each of the at least two time intervals to the at least two output nodes allocated to the respective time interval.

The pixel device according to the invention is thus capable of demodulating optical waves at very high speed and with high sensitivity at the same time. The transfer of the photo-generated electrons over the potentially large photo-sensitive area of the detection region is mainly accomplished by a lateral, static drift field, which is a constant electric field. That leads to a very fast transportation process in the charge domain and high demodulation frequencies up to the Gigahertz range are reachable without any loss of sensitivity. The in-pixel demodulation process is performed in the almost noise-free charge domain. The requirements to the driving electronics are reduced as well, because any dynamically controlled structure in the pixel have sizes that are as small as possible. The demodulation of the photo-generated charge-flow signal, also called signal of flowing charges or signal of charge flow, is performed by fast activation of conduction channels. These conduction channels have smallest path lengths of charge transport. The fast transportation process and the fast activation of conduction channels, which are transfer means, enable the demodulation of high signal frequencies. Furthermore, the small size of the demodulation area means small parasitic capacitances of the control gates which have to be quickly charged or recharged so that a large number of pixels can be driven with high frequencies at the same time. The overall requirements on the driver electronics are drastically reduced due to the small capacities and hence, the demodulation efficiency is even increased further.

High optical sensitivity of the pixel is possible because the size of the detection area can be largely designed only limited by the maximum transfer speed of charges in the semiconductor substrate and the associated maximum demodulation frequency.

Based on that pixel architecture, sensors for many different applications can be realized. In particular these are applications with the need of demodulating optical waves, for example three-dimensional imaging, fluorescence measurement, optical data transfer, etc.

The pixel device according to the invention is able to demodulate optical signals at low as well as high frequencies, e.g., up to several hundreds of MHz. Concurrently to the high-frequency demodulation which is supported, the pixel also provides high optical sensitivity at the same time.

The pixel device according to the invention defines a distinction between the photo-detecting region and the potentially non-photo-sensitive demodulation region without leaving the operation point of the pixel being in the low-noise charge-domain. The photo-detection region consists of an architecture that allows creating a constant lateral drift field in the substrate. The constant drift field enforces photo-generated charges to drift into the direction of higher electrical potential. Various possibilities for the generation of constant lateral drift fields exist. To name some examples: high-resistive gate structures, consecutive biased gates, floating gates or floating diffusions in the substrate. The demodulation region, whether photo-sensitive or not, is designed as small as possible, only constrained by the particular process rules. The photo-generated charge carriers are injected into the demodulation region and drained through one of the conduction channels to a so-called storage site. The particular conduction channel is activated by a voltage signal on one of the contacts. The specific control of activation of the conduction channels corresponds to the demodulation process.

The pixel device according to the invention is less susceptible against asymmetric demodulation, i.e., an unequal sampling process in the demodulation region. The reason for less susceptibility is that the demodulation process is not influenced anymore by the direction of the light impinging on the pixel. This is even more advantageous if the demodulation region is designed as non-photo-sensitive.

Another advantage of the demodulation means of the pixel device is the possibility of designing non-stripe-like structures, but square pixel shapes. That leads to a tremendous improvement of spatial (lateral) sampling of the scene and it enables the efficient use of micro-lens arrays. Still another advantage of the pixel device is less distortion of the sampling signal due to delays, and attenuations within the demodulation region because the dynamically controlled part of the pixel is kept as small as possible. The large photo-sensitive detection region is controlled statically.

The pixel device according to the invention is applicable to all kinds of applications where a detection of electromagnetic waves is necessary. Moreover, the pixel device is best-suited for applications where a demodulation of the electromagnetic wave is required, in particular if the wave is an intensity-modulated optical signal. The demodulation capability of the pixel at high frequencies and with high optical sensitivity at the same time makes the pixel extremely suitable for three-dimensional distance measurements with high accuracies. The set-up of complete one- or two-dimensional arrays allows three-dimensional acquisitions in real-time and without any moving parts within the whole system. Any modulation scheme is applicable, i.e., sine-wave modulation, rectangular modulation, coded modulation schemes such as pseudo-noise modulation as well as frequency-modulated signals and chirp signals. However, beside the just mentioned continuous-wave modulation methods, also pulse-modulated schemes are applicable with the pixel device of the present invention.

The photo-sensitive pixel device according to the present invention enables the sampling of modulated electromagnetic waves, in particular in the optical range, with highest accuracy. It has a compact size and hence, it can be well integrated with additional electronic circuits on one single chip. The special architecture allows for fabricating that pixel in any standard complementary metal oxide semiconductor (CMOS) or charge coupled device (CCD) process with silicon as substrate material, making the fabrication very cost-efficient. Alternative substrate materials, such as silicon germanium and so on, support even higher frequencies.

BRIEF DESCRIPTION OF THE DRAWINGS

Embodiments of the invention and, for comparison, a prior-art device are described in greater detail hereinafter relative to the attached schematic drawings.

FIG. 6 show five different embodiments of the structure of a detection region according to the invention.

FIG. 7 show a first embodiment of the structure of the demodulation region according to the invention.

DESCRIPTION OF PREFERRED EMBODIMENTS

Figure 1:
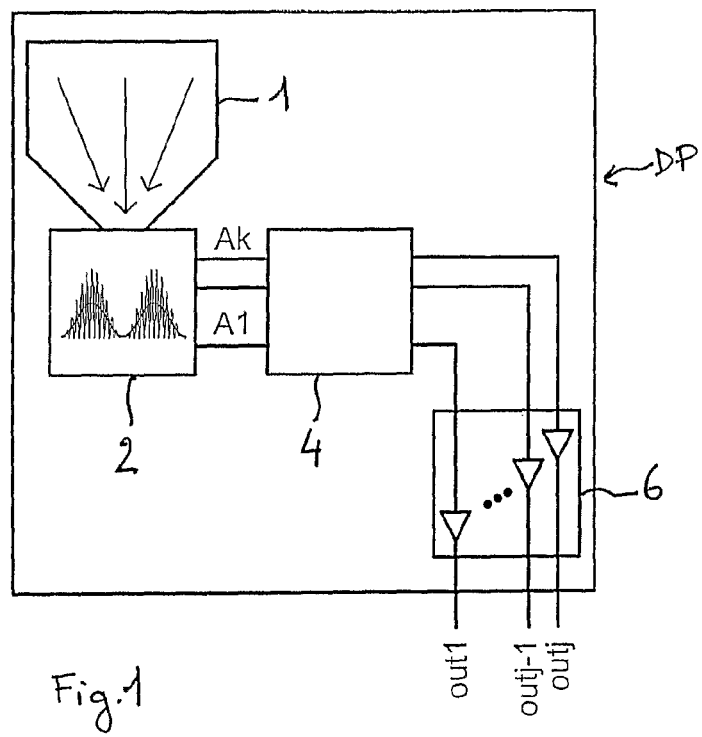
FIG. 1 shows a general block diagram of the structure of a demodulation pixel according to the invention.

FIG. 1 shows a photo-sensitive pixel according to the invention. This photo-sensitive pixel DP comprises a photosensitive detection region 1, a demodulation region 2, an optional stage 4 for any kind of data processing and optionally amplification circuitry 6. On reception of electromagnetic radiation, e.g. light radiation, on the photo-sensitive area of the detection region 1 and potentially of the demodulation region 2, photo charge carriers are generated.

The detection region 1, in particular if largely designed, needs to transport the photo-generated charge carriers to the demodulation region 2 as fast as possible in order to minimize any low-pass filtering effects on the opto-electronically converted signal, also called electric signal of flowing charges or photo-current signal. The fast charge-carrier transport to the demodulation region 2 is realized by a lateral drift field into the particular direction. That drift field can be generated by various methods. The following itemization of some possible methods does not restrict the pixel to only those approaches. One possible realization of static drift fields is made by a photo-transparent gate of high-resistive material above the semiconductor substrate and an insulator layer. Hoffmann describes such architecture for memory devices ("Surface Charge Transport with an MOS-Transmission-Line", Solid-State Electronics, Vol. 20, pp. 177-181, 1977). The appliance of a potential difference generates a current flow through the gate and hence a constant lateral electric field is created. That potential distribution is mirrored to the semiconductor substrate due to the capacitive coupling between the gate and the semiconductor so that photo-generated charges will be directed by the electric drift field. Other examples for generating lateral electric drift fields within the photo-sensitive detection region of the pixel apply fragmented gate structures, floating gates or floating diffusions as illustrated in the preferred embodiments of the invention. Furthermore, the build-up of a lateral step-wise doping gradient at the semiconductor surface results in a detection region with built-in drift fields that do not need necessarily any further voltage application. The basic idea of such built-in drift fields has been described by Lattes ("Ultrafast Shallow-Buried-Channel CCD's with Built-in Drift Fields", IEEE Electron Device Letters, Vol. 12, No. 3, March 1991). In any case, it is preferable that the drift field dominates the charge-carrier diffusion processes so that the velocity of charge v into the direction of the demodulation region can be estimated as $$v = \mu * E\text{drift},$$

wherein $\mu$ describes the mobility of charge carriers in the semiconductor substrate and Edrift is the electric field. This proportional relationship between the velocity of charge carriers and the drift field is valid until saturation effects of the charge mobility occur due to very-high voltages. In this case, non-linear models, well-known in the field of semiconductor research, have to be taken into account. Some different models are described e.g. by Jacoboni ("A Review Of Some Charge Transport Properties Of Silicon", Solid-State Electronics, Vol. 20, pp. 77-89, 1977). The maximally achievable velocity is called saturation velocity vsat. It is a material-specific parameter and defines the maximum reasonable drift field Edriftmax applied to the detection region of the pixel. In a first approximation, based on the linear relationship between the velocity and the drift field, the maximal reasonable drift field is calculated as follows:

$$E\text{driftmax} = v\text{sat}/\mu$$

The photo-generated charges are directly injected into the demodulation region 2 which performs a correlation process of the photo-current signal with a reference signal. Thereby the demodulation region may be partly or even completely photo-sensitive, but it also may be non-photo-sensitive because the size of the demodulation region 2 is much smaller than the one of the actual detection region 1. The output of the demodulation region 2 is a set of k sample values A1 to Ak of the modulation signal, k being a positive integer having a value at least equal to 2. Any kind of processing circuitry 4 may be used for a direct, pixel-inherent processing of the samples, e.g. analogue- to digital converters. Finally, each pixel delivers j output values out1 to outj which may be amplified already in the pixel itself, j being a positive integer. Such amplifiers may be compared to amplifier stages in standard APS (Active-Pixel Sensors). If no processing circuitry 4 is included in the pixel, then the pixel has j output values corresponding to the number of samples k, with j=k.

Figure 2:
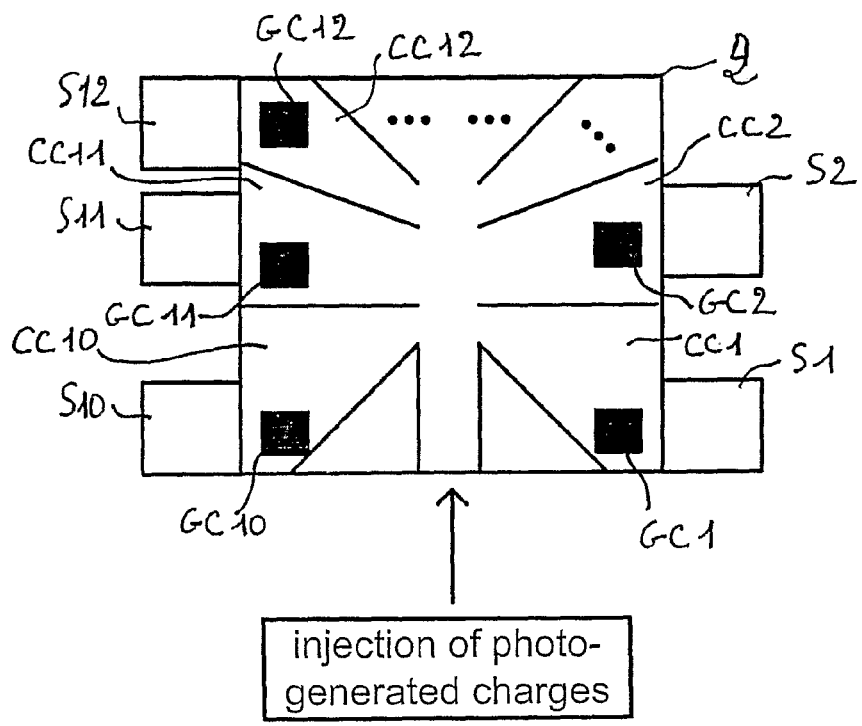
FIG. 2 shows a schematic view of a demodulation region according to the invention.

The demodulation region 2 performs a "correlation process" as expressed in terms of signal theory. The device utilized for this correlation process is depicted in general form in FIG. 2. After being injected into the device the photo-generated charge carriers are drained through so-called conduction channels CC1, ..., CCk to storage sites S1, ..., Sk which are situated beside the conduction channels. In the storage site the charges carriers are accumulated over a certain period of time. A total of k conduction channels and k storages sites exist within the demodulation region. Each conduction channel CC1, ..., CCk can be activated separately by one of the k contacts GC1, ..., GCk. The clever control of the channel activation allows for sampling the signal of the injected charge flow. The implementation of the demodulation region 2, also called demodulation unit hereinafter, is made e.g. by a compact gate structure with k contacts GC1, ... GCk. The structure can be internally built by several adjacent gates whose margins possibly overlap as it is provided by CCD processes. The geometrical widths of the gates do not have to exceed the minimal feature sizes as prescribed by the specific processing technology so that smallest possible demodulation units can be realized. Another possibility for the realization of the gate structure is a high-resistive gate similar as used for photo-sensing devices described in GB2389960A (Seitz, "Four-tap demodulation pixel") and in EPO44005489 (Büttgen et al, "Large-area pixel for use in an image sensor"). Again, the sizes should be kept as small as allowed by the design rules in order to get high fill factor and the support for high modulation frequencies at the same time.

All gate structures, whether used for the detection region 1 or the demodulation region 2, are built on the top of an insulator layer which separates the gate structure from the underlying semiconductor. The insulator has a thickness sufficient to enable the capacitive coupling between the semiconductor and the gate structure so that the potential distribution on the gate structure is always mirrored to the semiconductor surface. Without restriction of the invented pixel to any specific process, generally the thickness of such insulators ranges from a few nm to a few tens of nm in CMOS or CCD technologies, respectively. Whereby the semiconductor may, e.g., be silicon base material, the insulator mostly is semiconductor oxide and the gate structure consists of optically transparent and electrically conducting material, e.g. poly-silicon. Photo-generated charge carriers that are separated in the demodulation region 2 are basically minority carriers. Depending on the doping type, levels and profiles of the semiconductor substrate, either electrons or holes are transported within the detection and the demodulation regions 1 and 2 and converted into a voltage signal for readout after having been stored in the storage sites Sk and potentially been further processed by subsequent processing circuitry 4. A preferable embodiment of the invention comprises the information transport by electrons because the mobility of electrons is much higher than that of holes resulting in better demodulation performance. All transportations of charges below any gate structure can be realized in buried-channels in order to increase even more the efficiency of the charge transport.

The small size of the demodulation pixel allows for the integration of several pixels, i.e., a few hundreds or thousands, on a single chip. Each demodulation pixel is equipped with a reset line for the reset of the storage sites and select lines for readout purposes. Furthermore, k lines are connected to each pixel for the controlling of the k conduction channels CC1, . . . , CCk of the demodulation region 2. These k lines are used for dynamic signals. Two additional lines are connected with each pixel providing the voltage signals for the in-pixel drift fields. Other lines are used for the storage nodes and any potentially available logic circuitry.

Figure 3:
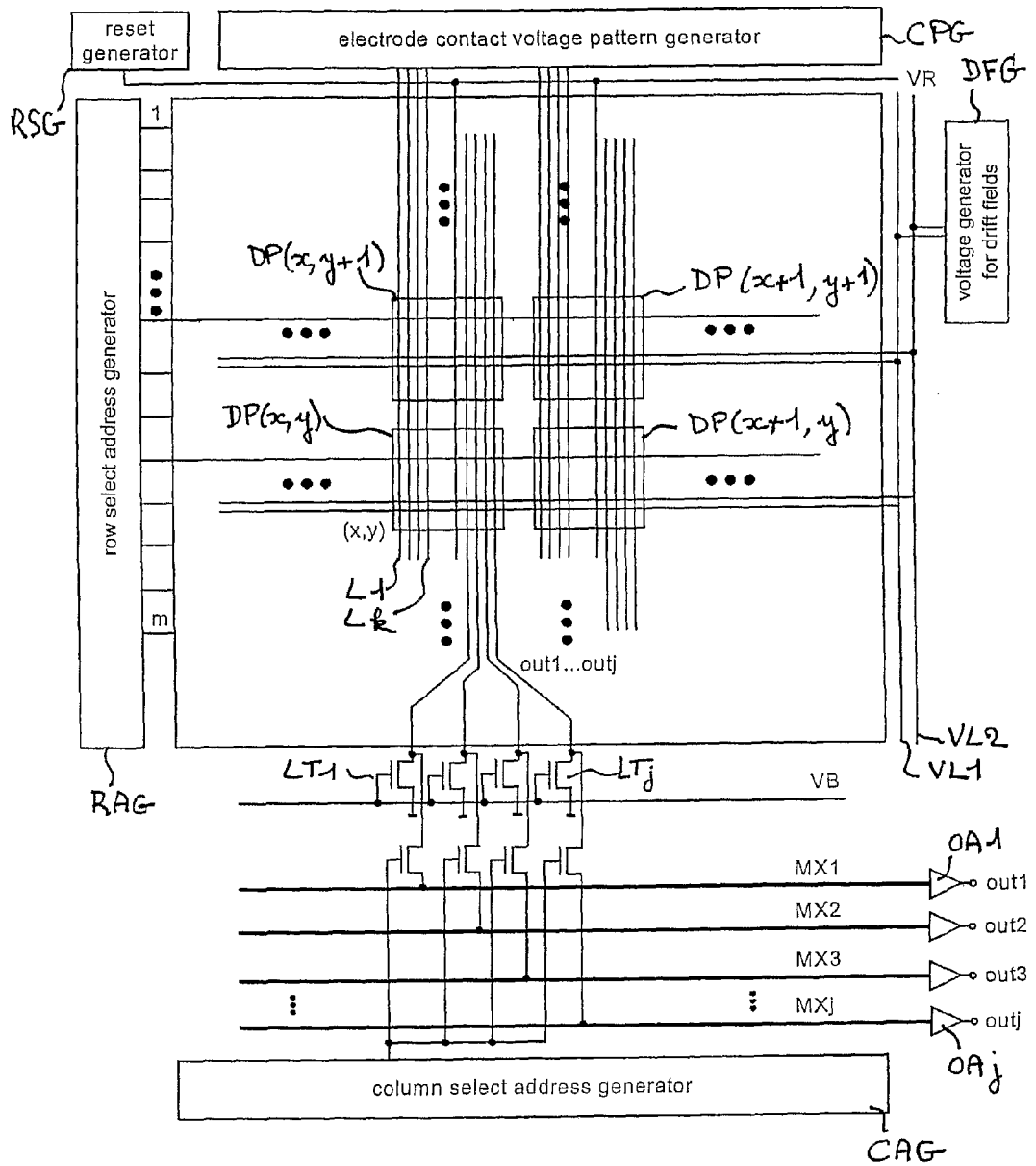
FIG. 3 shows a schematic view of an image sensor comprising a two-dimensional array of demodulation pixels according to the invention.

FIG. 3 shows particularly an example of the use of the pixel in an image sensor with a pixel matrix of m rows and n columns. Each pixel DP is designated with its spatial coordinates (x,y), with x being an integer having a value from 1 to n and y being an integer having a value from 1 to m. Sources are indicated: a row-select-address-generator RAG, a column-select-address-generator CAG, a reset generator RG for resetting the sampled value of the pixels, an electrode contact voltage pattern generator CPG for the controlling of the conduction channels in the demodulation region, a voltage generator DFG for the generation of a constant drift field in the detection module and a bias line VB.

Each pixel DP(x,y) is connected with the reset signal generator RSG via a voltage level VR and the voltage generator for the static drift field DFG in the photo-detection region. Two voltage levels VL1 and VL2 are responsible for the generation of the static drift field. The demodulation region requires k connection lines L1, . . . , Lk and k contacts GC1, . . . , GCk corresponding to the number of samples or storage sites in each pixel, respectively. According to the in-pixel processing of the k samples, j output values out1, . . . , outj per pixel will be available and amplified pixel-inherently. The load transistor LT1, . . . , LTj biased by line VB provides the correct current for the in-pixel amplifier. These load transistors LT1, . . . , LTj of the output amplifier stages are represented out of the pixel for purpose of getting higher fill-factors. However, such out-pixel amplifier may also exist in the pixel. The row-select-address-generator RAG may address one complete row so that the output values of all pixels of that row are multiplexed on j lines MX1 . . . MXj. The column-select-address-generator CAG enables the output of only one pixel value. Exemplarily, the pixel in row x and column y, DP(x,y) has been selected. The j output values are amplified again outside the pixel matrix, e.g. with operational amplifiers OA1, . . . , OAj or other amplifier technologies, in order to drive the external electronics and to compensate non-linearities of the first in-pixel amplification stage. A particular column may be selected by the column select address generator CAG. All column outputs are multiplexed on j multiplex lines MX1 to MXj.

Many applications require the measurement of phase delays between an optical signal and an electronic reference signal. Some examples are three-dimensional (3D) range measurement, fluorescence imaging or optical communication.

Figure 4:
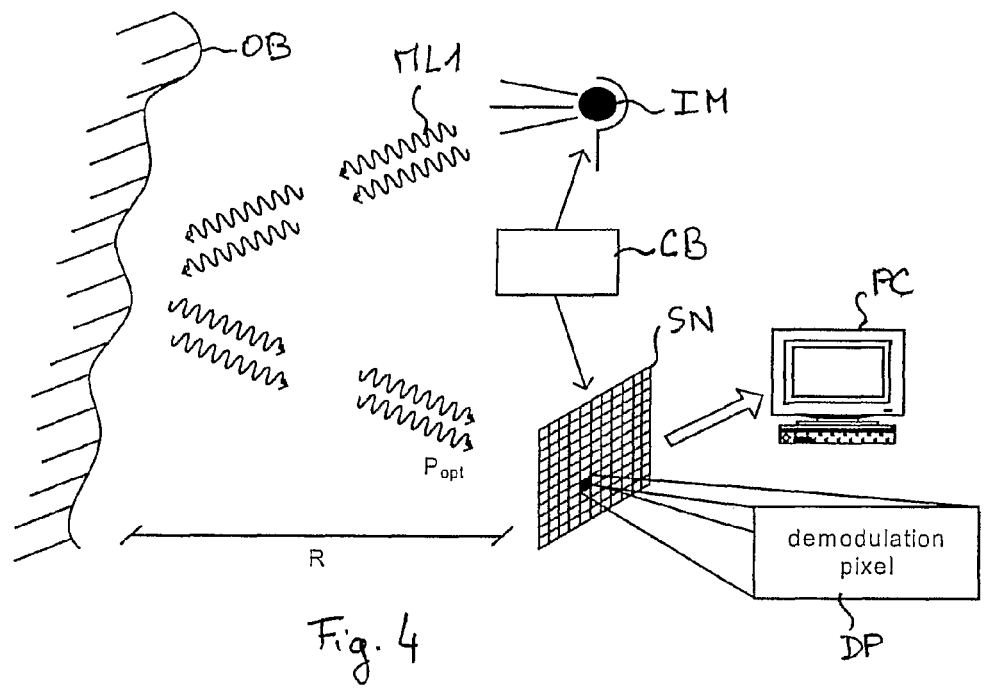
FIG. 4 shows a principle scheme of the three-dimensional-measurement set-up using a sensor comprising demodulation pixel.

The first example of three-dimensional imaging is picked out and depicted in FIG. 4 based on the utilization of the new pixel architecture.

Modulated light ML1 from a light source IM is sent to the object OB. A fraction of the total optical power sent out is reflected to the camera and detected by the image sensor. The sensor SN consists of a pixel matrix, each capable of demodulating the impinging light signal. The pixel DP comprises the architecture of the invented pixel having a detection region separated from the demodulation region. A separate control board CB regulates the timing of the whole system. The phase values of all pixels correspond to the particular distance information of one point in the scenery. They can be read out and displayed for example by a personal computer PC.

Figure 5A:
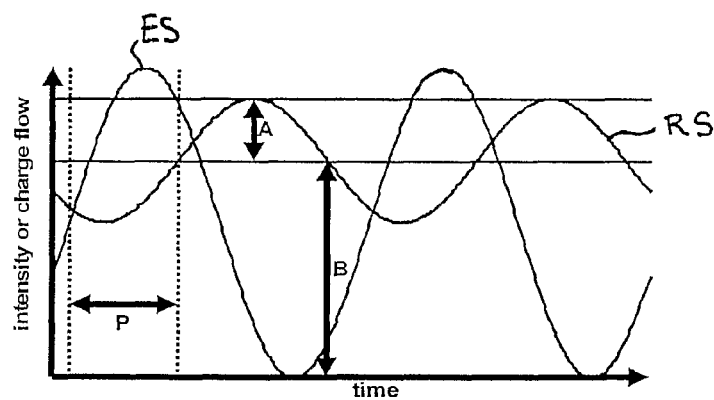
FIG. 5 show diagrams representing the optical intensity and the charge flow as a function of the time for the emitted signal and the received signal, respectively, using the principle of FIG. 4.
Figure 5B:
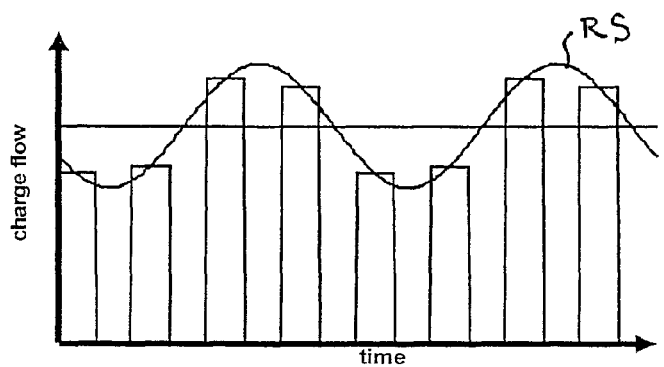

Thus, the acquisition of the distance information may be accomplished by the measurement of the time-of-flight. That is the time the light needs for the round-trip from the measurement system to the object OB and back again to the system. The distance R is calculated by $$R=(c*TOF)/2,$$

with c as light velocity and TOF corresponding to the time-of-flight. Either pulse intensity-modulated or continuously intensity-modulated light is sent out by the illumination module IM, reflected by the object OB and detected by the sensor SN. If each pixel of the sensor is capable of demodulating the optical signal at the same time, the sensor SN is able to deliver 3D images in real-time, i.e., frame rates of up to 30 Hz or even more are possible. In that application the demodulation capability of the pixel for that application enables the conclusion on the round-trip time or time-of-flight, respectively. In pulse operation the demodulation would deliver the time-of-flight directly. However, continuous modulation delivers the phase delay P between the emitted signal and the received signal, also corresponding directly to the distance R:

$$R=(P*c)/(4*pi*fmod),$$

where fmod is the modulation frequency of the optical signal. The relationship of signals for the case of continuous sinusoidal modulation is depicted in FIGS. 5(a) and 5(b). Although this specific modulation scheme is described hereinafter, the utilization of the pixel in 3D-imaging is not restricted to this particular scheme at all. Any other modulation scheme is applicable: e.g. pulse, rectangular, pseudo-noise or chirp modulation. Only the final extraction of the distance information is different. FIG. 5(a) shows both the emitted and received modulation signals ES and RS, respectively. The amplitude A of the received signal, the offset B of the received signal and the phase P between both signals are unknown, but they can be unambiguously reconstructed with at least three samples of the received signal. In FIG. 5(b), a sampling with four samples per modulation period is depicted. Each sample is an integration of the electrical signal over a duration dt that is a predefined fraction of the modulation period. In order to increase the signal to noise ratio of each sample, the photo-generated charges are accumulated over several modulation periods.

By activating the conduction channels CC1, . . . , CCk of the demodulation region alternately the photo-generated charge injected into the demodulation region 2 and spread out below the complete gate structure, is forced to drift or diffuse to the specific storage site. The alternation of the channel activation is done synchronously with the sampling frequency.

The electronic timing circuit, employing for example a field programmable gate array (FPGA), generates the signals for the synchronous channel activation in the demodulation stage. During the activation of one conduction channel, injected charge carriers are moved to the corresponding storage site S1, . . . Sk for accumulation. As example, only two conduction channels CC1, CC2 are implemented in the demodulation region 2. Then two samples A0 and A1 of the modulation signal sampled at times that differ by half of the modulation period, allow the calculation of the phase P and the amplitude A of a sinusoidal intensity modulated and offset-free current injected into the sampling stage. The equations look as follows:

$$A = (A0 + A1)/2$$

$$P = \arcsin[(A0 - A1)/(A0 + A1)].$$

Extending the example to four conduction channels CC1-CC4 and sample values requires in practice a different gate structure of the demodulation region with four contacts C1-C4 and four storage sites S1-S4 and an appropriate clocking scheme for the electrode voltages in order to obtain four sample values A0, A1, A2 and A3 of the injected current. Generally the samples are the result of the integration of injected charge carriers over many quarters of the modulation period, whereby finally each sample corresponds to a multiple of one quarter of the modulation period. The phase shift between two subsequent samples is 90 degrees.

Using these four samples, the three decisive modulation parameters amplitude A, offset B and phase shift P of the modulation signal can be extracted by the equations $$A = \mathrm{sqrt}[(A3 - A1)2 + (A2 - A1)2]/2$$

$$B = [A0 + A1 + A2 + A3]/4$$

$$P = \arctan[(A3 - A1)/(A0 - A2)]$$

FIG. 6 show five different structures DT1-DT5 for the detection region 1. Referring to FIG. 6, the parameter i is related to the particular structure of the demodulation region. Depending on the structure, it is an integer having a value from 1 to n (n>=2). The first structure DT1 shown in FIGS. 6(a) and 6(b) is based on a semiconductor-insulator-gate architecture, whereby a photo-transparent high-resistive material is used on which two contacts k1 and k2 are applied. On FIG. 6(b) is particularly visible the typical set-up of a CMOS or CCD device with high-resistive gate material GM1 on the top, the insulator layer IL1 below and the semiconductor substrate SUB1 wherein the charges are generated due to photon incidence. The gate GM1 is responsible for the creation of the lateral electric drift field when a voltage difference is applied to the contacts k1 and k2. The resulting potential distributions existing in the detection structure are schematically shown on FIG. 6(b). Minority carriers MIC generated by photo-detection will drift to the higher potential as indicated by the arrow A where they will be injected into the subsequent demodulation region 2.

In the three other structure examples of the detection region illustrated in FIG. 6(c) to FIG. 6(j), the elements of the structure in common to FIGS. 6(a) and 6(b) have the same references. In all these examples, the substrate may have a general trapezoidal form with two opposite parallel sides, the first contact K1 being situated at the larger of these two parallel sides and the second contact K2 at the smaller of these two parallel sides. The second contact is adapted to be arranged between the detection region and the demodulation region as will be seen in FIG. 10. This particular trapezoidal form, or other form having the same properties, has the advantage that more than one trapezoidal element may be connected to a common demodulation region, the totality of the trapezoidal elements defining the detection region. As will be seen in FIG. 10 (a), this configuration increases the ratio between the size of the detection region/size and the demodulation region/size.

The second structure DT2 for the detection region shown in FIGS. 6(c) and 6(d) is based on the typical set-up of a CMOS or CCD device with a fragmented gate structure of high-resistive material composed of successive fragments GM1.i, e.g. successive separated stripes connected at their ends to each other. The rest of the structure comprises the same elements as in the first example of FIGS. 6(a) and 6(b) and the drift field is also generated by the current flow. The fragmented gate structure is aimed at reducing the power consumption of the gate itself. As shown in FIG. 6(d) the lateral electric drift field is approximately constant.

FIGS. 6(e) and 6(f) show a third example of structure DT3 for the detection region. The detection region comprises photo-transparent floating gates FGi, i.e. successive adjacent stripes which are coupled between them. The rest of the structure comprises the same elements as in the first example of FIGS. 6(a) and 6(b). Two voltages are applied to the contacts k1 and k2 each situated on one of the outer gate FG1, FGn of the gate structure. The inner gates take up intermediate voltages due to the capacitive coupling between themselves. Thus, the capacitive coupling between each gate allows the creation of a constant drift field which is mirrored to the surface of the semiconductor substrate SUB1. This detection region functions without any power consumption.

FIGS. 6(g) and 6(h) show a fourth example of structure DT4 for the detection region. The detection region comprises no gate structure but a substrate SUB10 having successive parallel floating diffusion regions FDi within a doping well or channel of opposite doping concentration than the floating diffusions themselves. The two contacts k1 and k2 are directly connected to the outer diffusion regions FD1, FDn. Thus, two voltages are applied to these two contacts, and thus to the corresponding outer diffusion regions, so that the inner diffusion regions take up intermediate voltages. This is done due to the punch-through mechanism, thus creating the drift fields for the fast charge transport. This example avoids any power consumption of the detection region by using floating diffusions.

FIGS. 6(i) and 6(j) show a fifth example of structure DT5 for the detection region. The detection region comprises a gate structure whereby each parallel gate VGi is connected to a specific voltage. The voltage could be tapped from a line of linear resistors RL1-RLn−1 for example, that is integrated inside or outside the pixel. The particular appliance of gate voltages defines the potential characteristics in the substrate SUB1. In the example, n gates with n bias voltages V1, . . . , Vn are depicted leading to a linear potential gradient in the substrate as shown in FIG. 6(j).

Figure 8A:
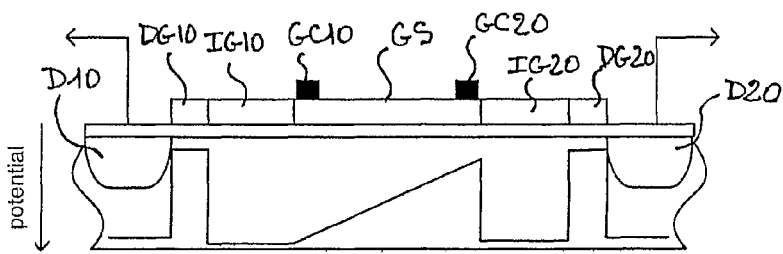
FIG. 8 show a second embodiment of the structure of the demodulation region according to the invention.
Figure 8B:
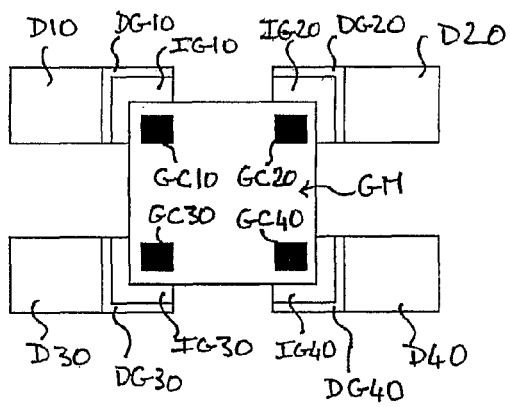

FIGS. 7 and 8 illustrate two examples of demodulation region according to the invention.

FIG. 7 show one example for the demodulation region based on a charge-coupled device architecture delivering two samples of the injected modulated current of photo-generated charges. The demodulation region comprises a gate structure with three consecutive gates, i.e. the Left Gate LG, the Middle Gate MG, the Right Gate RG, consecutive to the gate LG, respectively to the gate RG, is an integration gate IG1 then a decoupling gate DG1, respectively an integration gate IG2 then a decoupling gate DG2. Moreover, in the example of FIG. 7 two gate contacts GC1, GCm are situated on each gate. Photo-generated charges coming from the detection region are fed into the demodulation stage below the middle gate MG. The adjacent two gates LG and RG, respectively on the left and right of the middle gate MG are used to activate either the left or the right conduction channel for demodulation purpose, respectively. Such an activation means to set the potential of either the left or the right gate higher than the potential of the middle gate MG and to set the potential of the other right or left gate smaller than the potential of the middle gate MG. An illustration of the potentials applied to the different gates at a given time is shown in FIG. 7(a). In this particular example, the left gate having a higher potential than the middle gate, the left conduction channel is used. Thus, a "conduction channel" may be defined by the succession of gates between a first and a second gate, an increased potential between the first and the second gate leading the charge carriers from the first gate to the second gate. A conduction channel is activated by a high voltage signal when p-doped semiconductor substrate is utilized. On both sides the particular charge carriers are stored below the integration gate IG1 or IG2. The outer gates called decoupling gate DG1 and DG2 inhibit the charges to diffuse uncontrollably to the outputs nodes D1, D2, also called sense nodes. When the charge carriers accumulated in one of the integration gate IG1 or IG2 are to be transferred to the diffusion region D1 or D2 of the demodulation region, the potential level of the integration gate IG1 or IG2 and of the left and right gates LG and RG is set to the potential level decoupling gate DG1 or DG2 enabling the diffusion of the charge carriers to the diffusion region D1 or D2.

A second example of a demodulation stage is depicted in FIG. 8. This architecture is based on a gate structure with one closed gate GS and four gate contacts GC10-GC40. Near each gate contact GC10-GC40 is an integration gate IG10-IG40 followed by a decoupling gate DG10-DG40. Near each decoupling gate DG10-DG40 is a corresponding diffusion region D10-D40 in the substrate. The potential gradient of the different gates and diffusion regions is shown as an example in FIG. 8(a). The potential gradient below the closed high-resistive gate GS due to a current flow through the gate itself enables the fast separation of the injected charges to just one storage node comprising an integration gate. The current is injected below the closed gate and between two adjacent contacts. A conduction channel is realized when applying a potential on one of the gate contact, e.g. GC10, higher than the potential of the other gate contacts of the demodulation region. The charge carriers are thus conducted to the corresponding integration gate IG10. The integration gates correspond to the storage sites of charge carriers, similar as in FIG. 7. Also in this example, the outgate structure comprising the decoupling gates inhibits the uncontrollable diffusion of charges to the sense nodes. The readout of the samples may need additional amplification stages in order to be able to drive the capacities of the subsequent electronics fast enough.

Figure 9A:
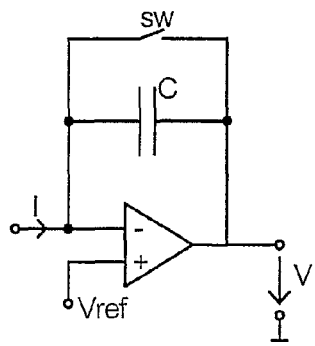
FIG. 9 show two known embodiments for the realization of an amplifier used in or out of the demodulation pixel according to the invention.
Figure 9B:
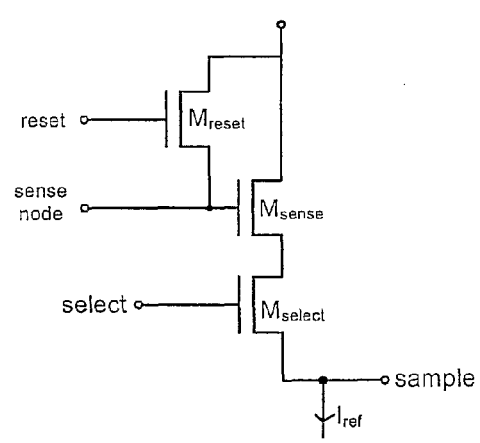
Figure 10A:
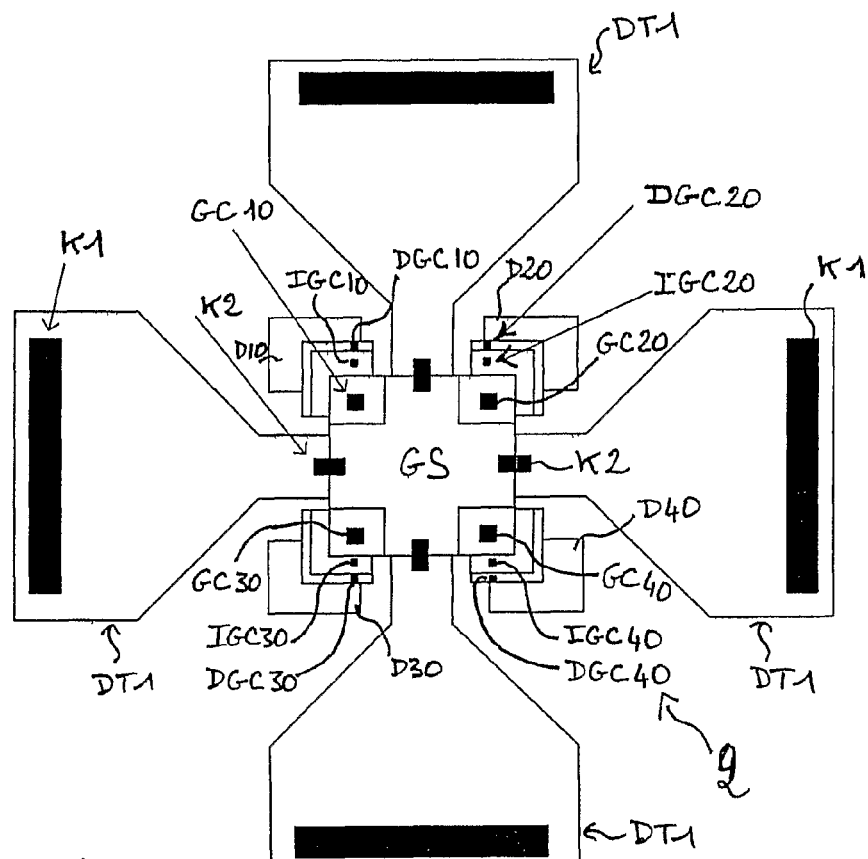
FIG. 10 show four embodiments of a demodulation pixel according to the invention.
Figure 10B:
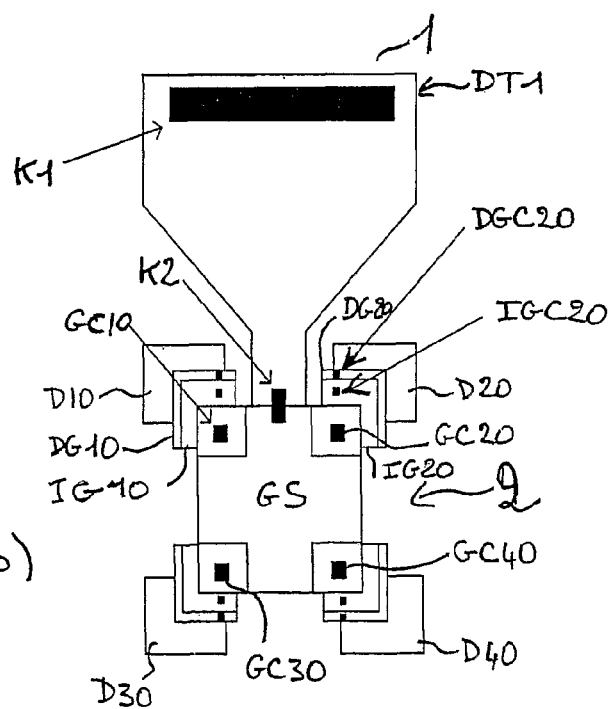
Figure 10C:
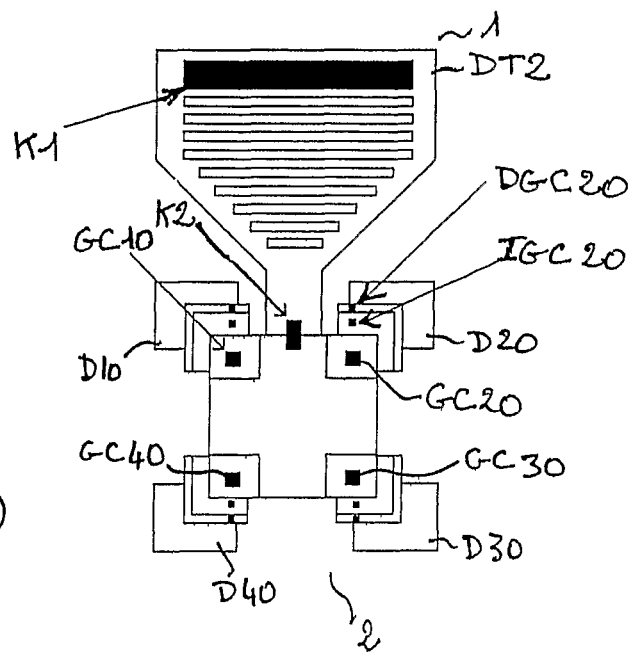
Figure 10D:
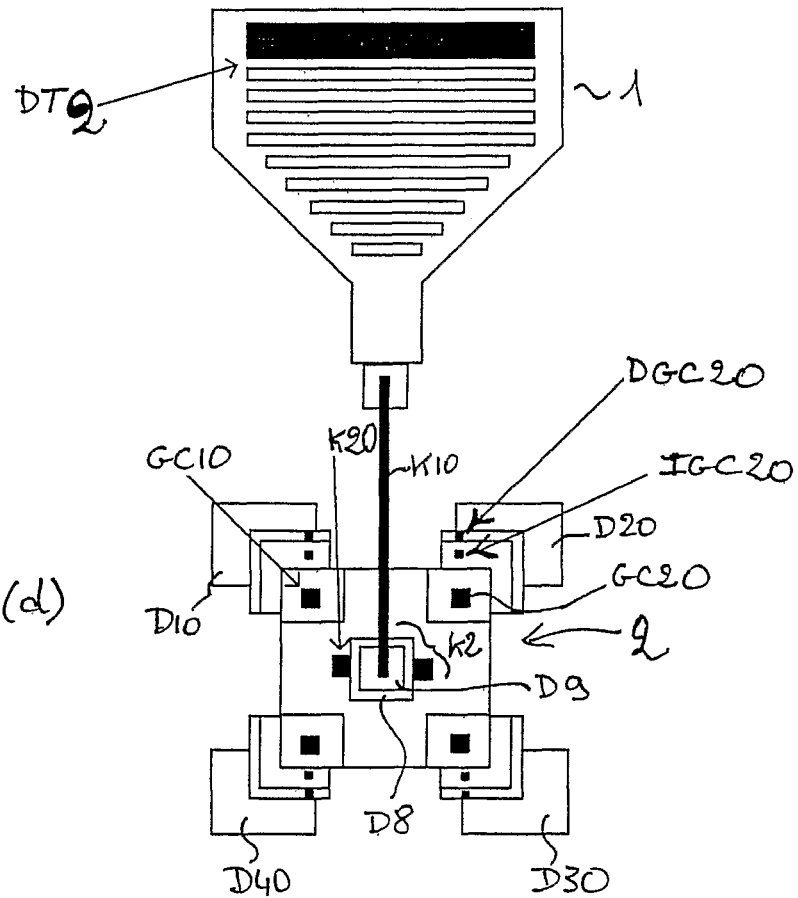

Two possible amplification stages are shown in FIG. 9. The first one is a Miller integrator, whereby its capacity would replace the sense diffusions sketched in FIGS. 7 and 8. The second amplifier is a source follower circuit, widely used in imaging sensors for the readout of pixels.

The pixels in FIG. 10 have one area of drift field, in the example produced by high-resistive, potentially dendritic gate structure which is photo-transparent. The photo-transparent high-resistive gate structure allows the generation of a photo-current below in the substrate whereby the current is foreseen to flow to the demodulation region due to the drift field. The demodulation stage is in these FIG. 10 exemplarily depicted as a four sample CCD structure whereby the closed gate structure is set to the same intermediate voltage as the low-voltage node of the high-resistive gate. Four storage nodes are included. Advantageously, the demodulation region is some factors smaller than the actual photo-sensitive region, i.e. the detection region, with its constant drift fields.

The pixel in FIG. 10 comprises a demodulation region as illustrated in FIG. 6(a): four sample nodes, four gate contacts GC10-GC40 and one closed gate structure GS. In FIG. 10(a), the detection stage is formed by four geometrically symmetrical gate structures DT1 as shown in FIG. 6(a) and four corresponding injection nodes, also identified as the contact K2. The contact K1 is set to low voltage and the contact K2 is set to an intermediate voltage, so that a linear potential gradient is generated within the detection region. Thus, the four detection regions of static drift field are photo-sensitive and enforce the photo-generated charges to drift to the demodulation region. The four contacts GC10-GC40 of the demodulation region control the activation of the conduction channels. They toggle between low voltage and high voltage levels. The four contacts IGC10-IGC40, corresponding to the contacts of the four integration gates IG10-IG40, are set to an even higher voltage in order to enable the storage of the photo-generated charges. The four contacts DGC10, . . . , DGC40 control the decoupling gate, also called outgate, and therefore they need a low voltage. In FIG. 10(b), the pixel is similar as the one depicted in FIG. 10(a) but only one detection region of static drift field is responsible for the charge injection into the demodulation stage. The detection region comprises a detection structure DT1, i.e. a closed high-resistive gate, as illustrated in FIG. 6(a). FIG. 10 (c) shows an example of a pixel with a detection region having a dendritic gate structure of combined high-resistive and/or low-resistive material showing less power consumption, this detection structure correspond to the one illustrated in FIG. 6(c). FIG. 10(d) shows the same detection region as in FIG. 10(c). However the injection of the photo-generated charges is different. In FIGS. 10(b) and 10(c), the charges need different time delays to reach the different storage nodes. In order to avoid that "smearing" effect, the charge injection may be performed into the middle of the demodulation region. The contact K2 comprises a first contact element K10 at the end of the detection region, two additional diffusion regions D8, D9, one at the end of the first contact element K10 and one in the middle of the demodulation region, i.e. in the middle of the closed gate structure GS, and connecting them together, contact elements K20 on the closed gate structure GS may be foreseen near the diffusion region D8. Thus the injected photo-generated charges will need the same time to travel to every storage node. That example shows that the charge injection does not have to be accomplished from the side of the demodulation region, as depicted in FIGS. 10(a), 10(b) and 10(c). Moreover, the injection into the middle of the demodulation region enables to avoid smearing effects. The particular implementation is not restricted to the example in FIG. 10(d).

Figure 11:
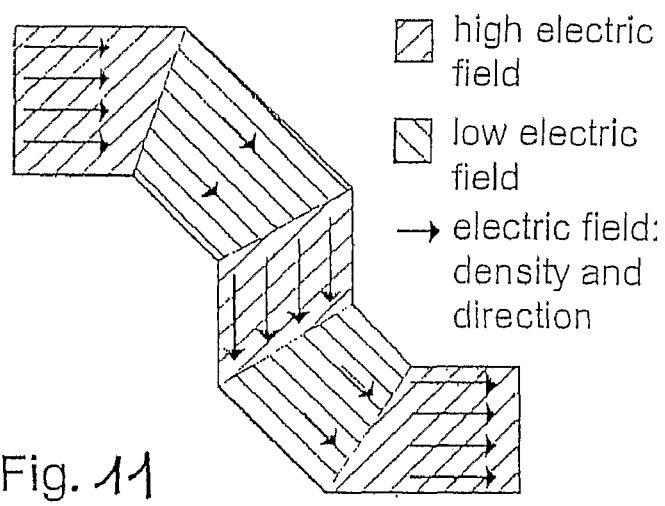
FIG. 11 shows a desired two-dimensional electric field distribution for a dendritic gate structure
Figure 12:
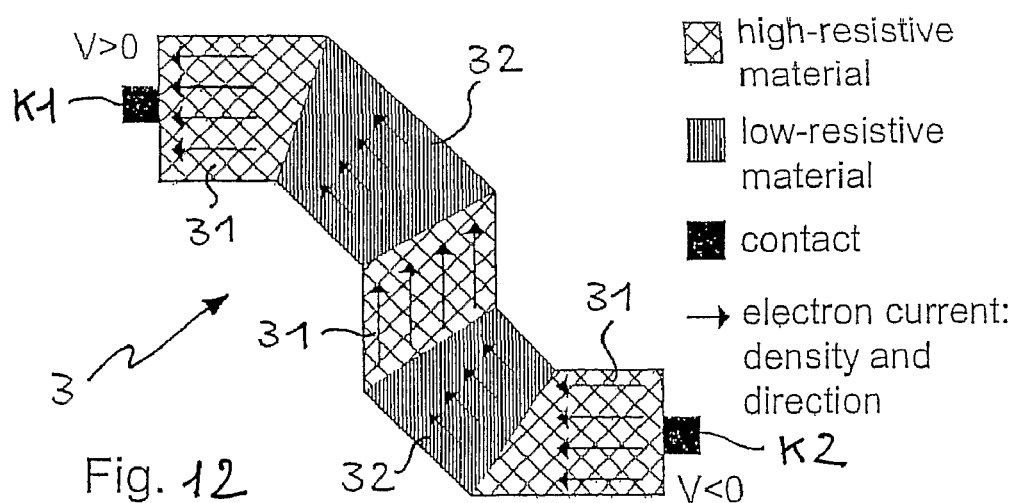
FIG. 12 shows a top view of combined low-high-resistive gate structures realizing the electric field distributions.

In reference to FIG. 6, 7 or 8, the gate structure of either the detection region or the demodulation region could also be fragmented, dendritic or arborescent, in order to reduce even more the power consumption. Such a gate structure having its electrode layer in an arborescent shape is described in European patent application No. 04'405'489. A very simple example of the realization of a particular electric field distribution is depicted in FIGS. 11 and 12. FIGS. 11 and 12 are directed to the detection region as example only, the demodulation region may also be could also be fragmented, dendritic or arborescent.

FIG. 11 shows a desired two-dimensional electric field distribution, and FIG. 12 shows a combined low- and high-resistive gate structure 3 realizing the electric field distribution of FIG. 11. The architecture of the dendritic gate 3 allows the creation of any arbitrarily chosen two-dimensional distribution of the electric field in the gate 3 and in the semiconductor material. A two-dimensional arrangement of high- and low-resistive gate materials 31, 32 generates a two-dimensional electric field distribution varying in magnitude and direction.

In this case, the combination of high- and low-resistive materials 31, 32 in the gate 3 is the fundamental tool for the generation of a desired electric field distribution due to a current flow through the gate 3 itself. Typically, whenever a specific two-dimensional electric field distribution is required, the topology of the corresponding gate structure 3 is of two-dimensional nature, too.

The dendritic gate 3 itself is contacted at its periphery with at least two (or more) contacts K1, K2 that are connected to static or switchable voltage sources, depending on the operation mode. Between the contacts K1, K2 there is at least one connection of high-resistive gate material 31.

The current flowing through the dendritic gate structure 3 produces the two-dimensional potential distribution shown in FIG. 11, which is essentially reproduced in the top region of the semiconductor bulk.

The shape of the electrode layer 3 or its complementary shape may be harp-like, comb-like, tree-like, snake-like, ice-crystal-like, or is a perforated plane. This dendritic shape, if used as gate structure GS of the demodulation region, has the advantage to realize the optimum compromise between demodulation frequency, response speed due to the RC time constant of the dendritic gate, and the total power consumption of the Sate and its associated electronic driving circuit.

Figure 13:
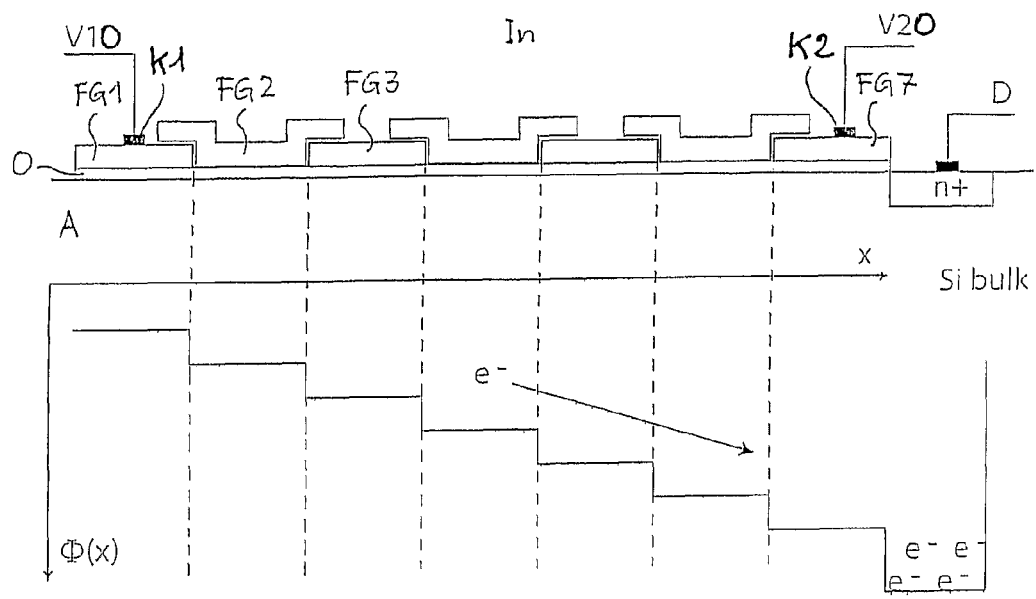
FIG. 13 shows a cross section of a detection or a demodulation region having floating gates.
Figure 14:
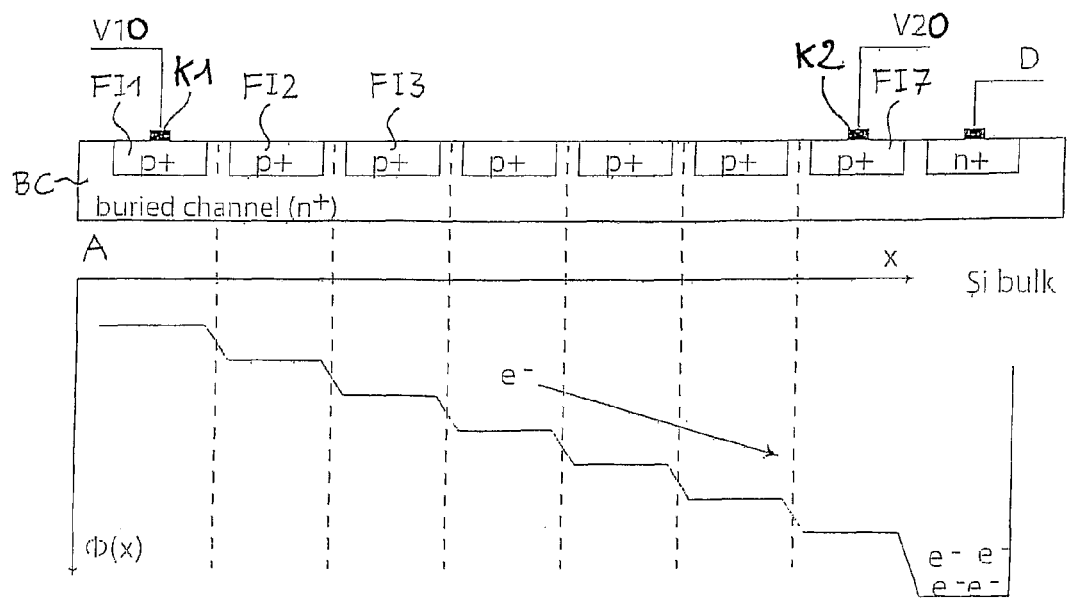
FIG. 14 shows a cross section of a detection or a demodulation region having floating implants.

Another implementation of the gate structure may be with floating gates or floating diffusion as described in European patent application No. 04'007'760. Examples of this implementation are shown in FIGS. 13 and 14. FIGS. 13 and 14 are directed to the detection region as example only, the demodulation region may also be implemented with a gate structure having floating gates or with floating diffusion.

FIG. 13 shows a cross section through a gate structure, offering a high response speed. On a semiconductor substrate A, a plurality of floating gates FG1-FG7 are arranged. The substrate A may be, e.g., made of bulk silicon of the p doping type. However, other materials such as Germanium and/or other doping types such as the n doping type can be used for the substrate; for such alternatives, the person skilled in the art will be able to make the necessary adaptations to the embodiments described here. The gates FG1-FG7 are typically made of undoped or doped polysilicon. They are electrically isolated from each other, e.g., by an oxide layer (not shown) in which they are preferably embedded. A thin (preferably 1-500 nm thick) insulator layer O, e.g., a silica layer, separates the substrate A from the gates FG1-FG7.

The two furthest gates FG1, FG7 are each contacted by an electric contact K1, K2. When two different voltages V10 and V20 are applied to the contacts K1 and K2, respectively, the intermediate floating gates FG2-FG6 take on an intermediate potential due to capacitive coupling. As a consequence, a discrete, steplike potential distribution $\Phi(x)$ is generated which depends on the horizontal coordinate x. The potential distribution $\Phi(x)$ acts across the insulator O at the interface between semiconductor substrate A and insulator O. Charge carriers, e.g., electrons e−, injected in the substrate A by the charge injection node are in move along the lateral electric field lines to the point of highest potential energy, e.g., K2 in case that V20 is larger than V10. Thus, according to the invention, the charge-separation and -transport task is taken over by a lateral electric field at the surface of the substrate A.

The charge-accumulation and -detection task is realized close to the contact K2 providing maximum potential. For this purpose, an n+ doped floating diffusion volume D is provided on the surface of substrate A in which the injected charge carriers are accumulated. The diffusion volume D is contacted by an electric contact for applying a voltage and reading out the charges. The potential of the accumulation diffusion D must be higher than the electrode-contact voltage V20, so that the minority carrier electrons are stored in the diffusion D. Alternatively, the charges can first be integrated below an integration gate and subsequently be read out through the diffusion volume D.

FIG. 14 shows a cross section of a detection or demodulation region using floating implants instead of a gate structure. In this embodiment, an array of floating implants FI1-FI7 is arranged on the surface of a semiconductor substrate A. The substrate A may be, e.g., made of bulk silicon of the p doping type. The floating implants FI1-FI7 may be p+ implants in an n+ buried channel BC.

The function of the embodiment of FIG. 14 is analogous to that of the first embodiment of FIG. 13. The two furthest floating implants FI1, FI7 are each contacted by an electric contact K1, K2, and two different voltages V10 and V20 are applied to the contacts K1 and K2, respectively. The intermediate floating implants FI2-FI6 take on an intermediate potential due to the punch-through mechanism. Thus an approximately discrete, step-shaped potential distribution $\Phi(x)$ is generated. The injected charge carriers, e.g., electrons e−, are detected in an n+ doped floating diffusion volume D in which they are accumulated.

If electrons are to be collected, the substrate A should be p doped. The accumulation diffusion D is of n+ type, and the voltages V10, V20 at the electrode contacts K1, K2 are such that the most positive voltage is applied to the contact K2 that is closest to the accumulation diffusion D. The voltages must be high enough so that a depletion zone extends from the semiconductor-oxide interface into the semiconductor substrate A. The potential of the accumulation diffusion D must be higher than the electrode contact voltage V2, so that the minority carrier electrons are stored in the diffusion D.

If injected holes are to be collected, the substrate A should be n doped. The accumulation diffusion D is of p+ type, and the voltages V10, V20 at the electrode contacts K1, K2 are such that the most negative voltage is applied to the contact K2 that is closest to the accumulation diffusion D. The voltages must be low enough so that a depletion zone extends from the semiconductor-oxide interface into the semiconductor substrate A. The potential of the accumulation diffusion D must be lower than the electrode contact voltage V20, so that the minority carrier holes are stored in the diffusion D.

Thus it may be an example of implementation of the demodulation region to provide one floating area and contact areas provided with electric contacts each being positioned near to each of the output nodes of the demodulation region. Thus, an electrical potential difference between the contact node K2 of the detection region and one of the contacts of the demodulation region may be applied for the demodulation.

This invention is not limited to the preferred embodiments described above, to which variations and improvements may be made, without departing from the scope of protection of the present patent.

LIST OF REFERENCE SIGNS 1 photo-sensitive detection region
2 demodulation region
4 processing circuitry
6 amplification circuitry
DP, DP(x,y) pixel device
S1, . . . , Sk storage sites
CC1, . . . , CCK conduction channels
GC1, . . . , GCk contacts
CPG electrode contact voltage pattern generator
DFG voltage generator
CAG column-select-address-generator
RAG row-select-address-generator
OA1, . . . , OAj operational amplifiers MX1, ..., MXj multiplex lines
Out1, ... outj outputs of the pixel device
LT1, ... LTj load transistors
L1, ..., Lk connection lines
VL1,VL2,VR voltage levels
VB bias line
OB object
IM light source
ML1 Modulated light
CB control board
SN image sensor
PC personal computer
ES emitted signal
RS received signal
DT1, ..., DT5 structures for the detection region
K1,K2 electrical contacts
IL1 insulator layer
SUB1, SUB10 semiconductor substrate
MIC Minority carriers
GM1 high-resistive gate material
GM1.1,GM1.i,GM1.n successive fragments of high-resistive gate material
FG1, FGi, FGn photo-transparent floating gates
FD1, FDi, FDn floating diffusions regions
VG1,VGi,VGn parallel gates
RL1, ..., RLn linear resistances
V1, ..., Vn, V10, V20 bias voltage
D1,D2,D10-D40 diffusion regions
GS gate structure
IG1,IG2,IG10-IG40 integration gates
DG1, DG2,DG10-DG40 GC1,GCm,GC10-GC40 decoupling gates
DGC10-DGC40,IGC10-IGC40 gate contacts
BC buried channel

The invention claimed is:

1. An imaging system, comprising
 a light source for illuminating with a modulated electromagnetic signal;
 a sensor comprising an array of pixel devices for sensing and demodulating the modulated electromagnetic signal that is incident on the sensor; and
 a controller for controlling the sensor and the light source; and
 wherein the pixel devices each comprise:
  a demodulation region including at least two output nodes for receiving charge carriers and moving the charge carriers to either of the at least two output nodes in dependence upon at least two time intervals within a modulation period of the modulated electromagnetic signal based on the timing regulation of the controller, and
  at least one photo-sensitive detection region in which the incident electromagnetic signal is converted into the charge carriers, the photo-sensitive detection region moving the charge carriers to the demodulation region.

2. An imaging system as claimed in claim 1, wherein a lateral extent of the photo-sensitive detection region decreases in a direction of the demodulation region.

3. An imaging system, comprising
 a sensor comprising an array of pixel devices for sensing an electromagnetic signal that is incident on the sensor;
 wherein the pixel devices each comprise:
  a photo-sensitive detection region in which the incident electromagnetic signal is converted into charge carriers, the photo-sensitive detection region moving the charge carriers across the photo-sensitive detection region, wherein a lateral extent of the photo-sensitive detection region decreases in a direction movement of the charge carriers.

4. An imaging system as claimed in claim 3, wherein the photo-sensitive detection region moves the charge carriers across the photo-sensitive detection region to a demodulation region.

5. An imaging system as claimed in claim 3, wherein the photo-sensitive detection region moves the charge carriers across the photo-sensitive detection region to a demodulation region using a lateral drift field.

6. An imaging system as claimed in claim 3, wherein the photo-sensitive detection region moves the charge carriers across the photo-sensitive detection region to a demodulation region using a lateral drift field that is generated by a current flow vertically adjacent to the photo-sensitive detection region.

7. An imaging system as claimed in claim 3, wherein the photo-sensitive detection region moves the charge carriers across the photo-sensitive detection region to a demodulation region using doping of a semiconductor substrate of the photo-sensitive detection region.

8. An imaging system as claimed in claim 1, wherein the photo-sensitive detection region moves the charge carriers across the photo-sensitive detection region to the demodulation region using a lateral drift field.

9. An imaging system as claimed in claim 1, wherein the photo-sensitive detection region moves the charge carriers across the photo-sensitive detection region to the demodulation region using a lateral drift field that is generated by a current flow vertically adjacent to the photo-sensitive detection region.

10. An imaging system as claimed in claim 1, wherein the photo-sensitive detection region moves the charge carriers across the photo-sensitive detection region to the demodulation region using doping of a semiconductor substrate of the photo-sensitive detection region.

* * * * *

UNITED STATES PATENT AND TRADEMARK OFFICE
CERTIFICATE OF CORRECTION

| | | |
|---|---|---|
| PATENT NO. | : 8,115,158 B2 | Page 1 of 1 |
| APPLICATION NO. | : 12/984931 | |
| DATED | : February 14, 2012 | |
| INVENTOR(S) | : Bernhard Buettgen | |

It is certified that error appears in the above-identified patent and that said Letters Patent is hereby corrected as shown below:

On the title page item (75), after "Bernhard Buettgen," delete "Adliswill" and insert --Adliswil--.

Signed and Sealed this
Fifteenth Day of May, 2012

David J. Kappos
*Director of the United States Patent and Trademark Office*